United States Patent [19]

Mayer

[11] Patent Number: 5,170,403

[45] Date of Patent: Dec. 8, 1992

[54] MODULATION CIRCUIT FOR GRAYSCALE LASER PRINTING

[75] Inventor: Christopher M. Mayer, Westford, Mass.

[73] Assignee: Digital Equipment Corporation, Maynard, Mass.

[21] Appl. No.: 708,163

[22] Filed: May 31, 1991

[51] Int. Cl.$^5$ .................................................. H01S 3/10
[52] U.S. Cl. ........................................ 372/26; 372/38
[58] Field of Search ........................................ 372/26, 38

[56] References Cited

U.S. PATENT DOCUMENTS 5,073,331 12/1991 Shirasaki .................................. 372/38
5,089,727 2/1992 Molitor et al. ........................... 372/38

Primary Examiner—Léon Scott, Jr.
Attorney, Agent, or Firm—Ronald E. Myrick; Barry N. Young; Ronald C. Hudgens

[57] ABSTRACT

A laser diode modulation circuit for grayscale laser printing provides variable control for both the current through the laser diode and the modulation (switching) of the diode in time. The size of a printed area within a pixel region is determined in two dimensions by the power output of the laser diode and the modulation of the laser diode within the pixel region. The power output of the laser diode is detected with a photodiode detector which is part of a feedback loop for adjusting the maximum bias current value of the diode. The maximum bias current value is held as a digital value with a digital counter, and is adjusted by incrementing or decrementing the counter. A drive current for the laser diode is selected for each pixel as a percentage of the maximum bias current value using an analog multiplexer. A modulation signal is generated in response to modulation information received, and controls the switching of the laser diode within a pixel region.

21 Claims, 5 Drawing Sheets

MODULATION CIRCUIT FOR GRAYSCALE LASER PRINTING

BACKGROUND OF THE INVENTION

Innovations in the field of laser xerography have always been motivated by the desires for more detailed and accurate printing. The high resolution of laser printers is one of their most beneficial features. However, the resolution of these printers has limitations. While 300 dot per inch printers are becoming commonplace, increasing the resolution further requires larger and more complex systems.

Most laser printers use an Organic Photoconductor (OPC) drum which has a photoconductive coating upon which an electrostatic charge is stored. Once a charge is placed on the OPC drum, a laser source is scanned across the surface of the drum to discharge specific regions of photoconductor. Depending on whether the printer is a "write white" or a "write black" type printer, the resulting charged and discharged regions of the drum define what will be dark or light regions of the resulting image. Thus, the image is in essence scanned onto the surface of the drum with the beam of the laser.

The terms "write black" and "write white" when describing laser printers refer, respectively, to whether the toner of the printer is to stick to the charged regions of the drum or the regions discharged by the laser. For example, using a toner with a charge opposite that of the drum results in the toner sticking to the drum in the charged regions and being repelled from the discharged regions. However, if a toner having the same charge as the charged regions of the drum is used, the toner is repelled from the charged regions. This toner remains in the discharged regions due to friction and the build up of charges in the discharged regions which have the opposite polarity to the toner.

Once toner is on the OPC drum in the desired locations, a sheet of paper is then passed by the drum, and by providing a strong electrical charge behind the paper, the toner is transferred from the OPC drum to the paper. The distribution of the toner on the page is a print of the distribution on the drum, creating the desired printed image on the page.

The use of the laser to scan the desired image onto the OPC drum allows a high resolution image to be formed. However, this resolution is typically limited by the resolution of the image data from the data output source. Nearly all standard software, for both text and graphics, uses a "bitonal" data output scheme. In a bitonal system, each image pixel is represented by a single data element (i.e. a bit), and is therefore either "on" or "off". Thus, the printer when scanning the image to be printed onto the OPC drum, is limited by the pixel resolution of the software, and each printed pixel is either completely darkened or completely blank.

A known method of increasing the quality of a printer output without increasing the resolution is through the use of a technique called anti-aliasing. In anti-aliasing, the high frequency components are filtered out of the printout and smoother edges and curves result. Different pixel locations on a printed page can be given different levels of darkness (or grayscale) by controlling the size of the printed spot in the pixel location. Thus, a grayscale capable printer can print a much smoother and clearer image by varying the tone of the printing in selected regions.

To adequately print a grascale image requires accurate control of the laser source of the printer to ensure the scanning of the proper area within a pixel region. Besides the control problems particular to the anti-aliasing grayscale printing method, the laser diode is known to be a sensitive device, and is easily destroyed by voltage spikes and overheating. In addition, its transfer curve changes radically depending on the junction temperature of the device. Thus, a properly controllable modulation circuit is imperative to ensure the desired scanning of the pixel regions of the grayscale printer, and to maximize the performance of a laser diode of the printer.

SUMMARY OF THE INVENTION

The present invention provides a modulation circuit for performing grayscale printing with a laser printer. Each pixel to be printed by a laser printer is represented by a pixel region on the OPC drum. A preferred embodiment is described with regard to a "write black" type printer, but it will be understood by those skilled in the art that the features of the present invention are equally applicable to a "write white" format. In the preferred embodiment, the charged region (i.e. area of charge stored on the surface of the drum) is defined by pulsed laser energy from the laser source. By varying the pulsing parameters of the laser, different features of the printed pixel result. A number of manipulable parameters of the laser beam are available for control. In the present embodiment, the control of the laser beam power controls the size of the charged region in a first direction, while control of the laser switching (on and off) determines the size of the charged region in a second direction.

A laser diode modulation circuit of the present invention allows the accurate control of the laser diode of a laser printer. The laser diode has an optical power output proportional to current flow through the diode. The optical power output of the diode is detected with a photodiode detector. The detector is part of a feedback loop which adjusts a maximum bias current value for the laser diode in response to changes in the optical power detected by the detector. Since changes in the diode temperature result in changes in the output power, the feedback loop allows the system to adjust the diode current with thermal variations. A digital counter is used to store the maximum bias current level as a digital value. This digital value is then output from the digital counter to a digital-to-analog (D/A) converter which generates the desired analog value. The adjustment of the counter may be continuous or may be made only periodically by using a latching element. In the present embodiment, a programmable array logic unit (PAL) is used in this capacity to produce an output which enables the counter only when a predetermined sequence of power signals are received by the PAL, such as a finite number of consecutive full power signals.

To select a desired power level of the laser diode for each pixel, a power level selector is provided which comprises an analog multiplexer. The analog value from the D/A converter is received by the power level selector, along with a power input signal in digital form. In response to the power input signal, the power level selector controls drive current of the laser diode as a variable percentage of the maximum bias current level output by the D/A converter.

The digital power input signal is one of two input signals which provides the laser printer with the grayscale information necessary to properly print each pixel. The other necessary input signal is a digital input code which is converted into a modulation signal used to modulate the laser diode. A signal generator, such as a programmable array logic unit (PAL) receives the digital code and outputs a corresponding modulation signal. The modulation signal modulates the current flow of the laser diode between zero and the drive current value specified by the power level selector.

The information received by the laser printer includes the necessary power information and the necessary modulation information for grayscale printing of each pixel region of the OPC drum (and therefore for each pixel region of a printed page). The power signal used by the power level selector controls the drive current through the laser diode, and therefore controls the size of the discharged portion of the pixel region in one direction on the OPC drum. The size of the discharged portion in the other direction is controlled by the switching on and off of the current through the laser diode by the modulation signal. For each pixel region of a subject image, the present invention circuit modulates the diode power and switching for a different set of grayscale values.

DETAILED DESCRIPTION OF A PREFERRED EMBODIMENT

Figure 1:
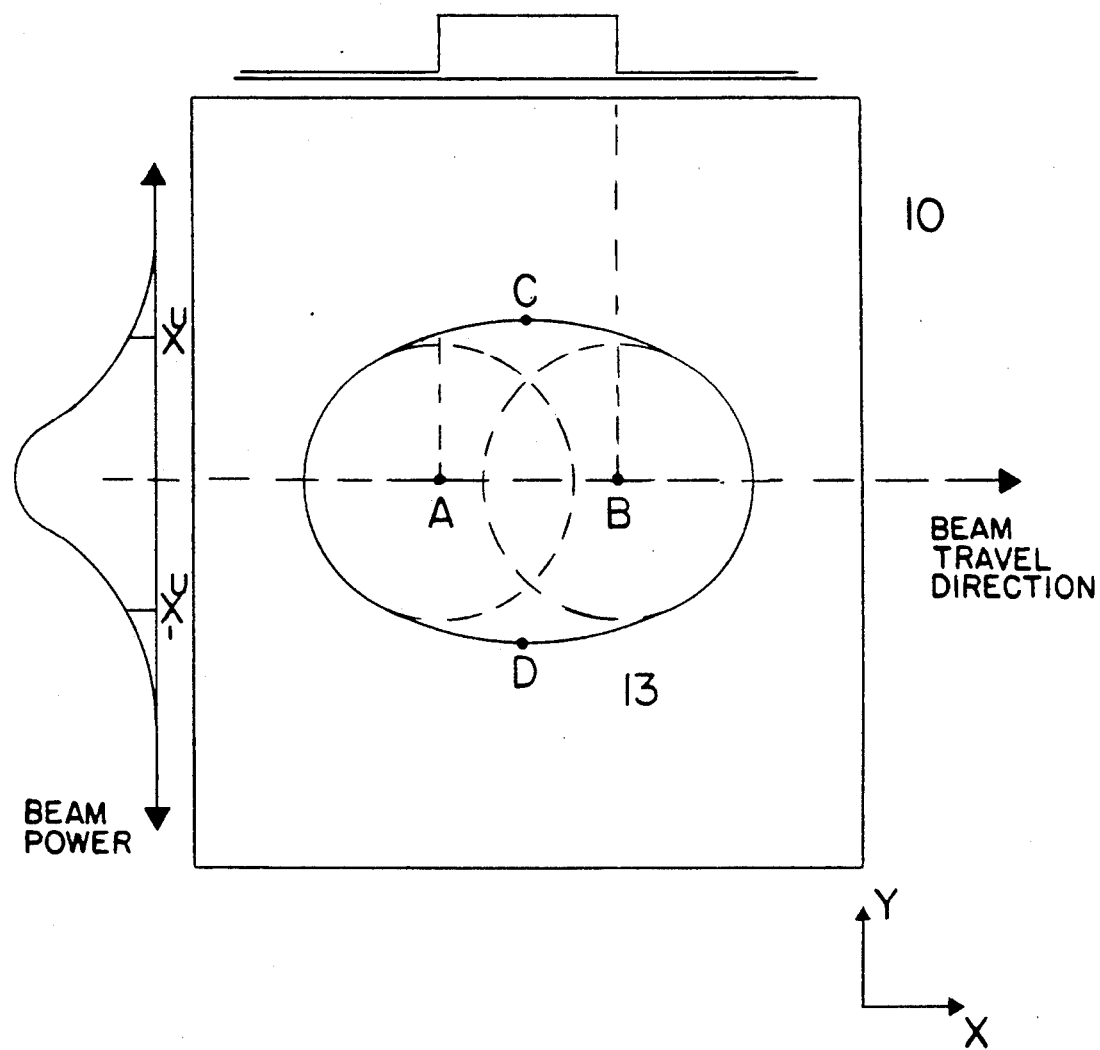
FIG. 1 illustrates the control of laser beam parameters within a single pixel region of an image to be printed by a laser printer.

In FIG. 1 is shown a graphic illustration of a pixel region 10 of an OPC drum of a laser printer. A beam of the laser sweeps across the pixel region to discharge a stored charge on the drum in selected parts of the pixel region. The two dimensions of the pixel region 10 are labelled x and y for reference purposes. In conventional bitonal printing, the entire pixel region is treated as a single unit, and is either left with the whole region charged, or is discharged in its entirety. Bitonal printing is thus relatively simple to implement, and requires only relatively low frequency modulation of the laser diode. However, with antialiasing printing techniques, only a portion of the pixel region is discharged, the size of that portion depending on the grayscale value for that pixel.

In a first embodiment, as a function of the grayscale value for a pixel region, the laser discharges an area of the pixel region, the size of the darkened shape being larger for higher grayscale values. For the purposes of description, the pixel region 10 of FIG. 1 is assumed to be square. However, those skilled in the art will recognize that rectangular or other pixel shapes can also be accomodated.

Figure 2:
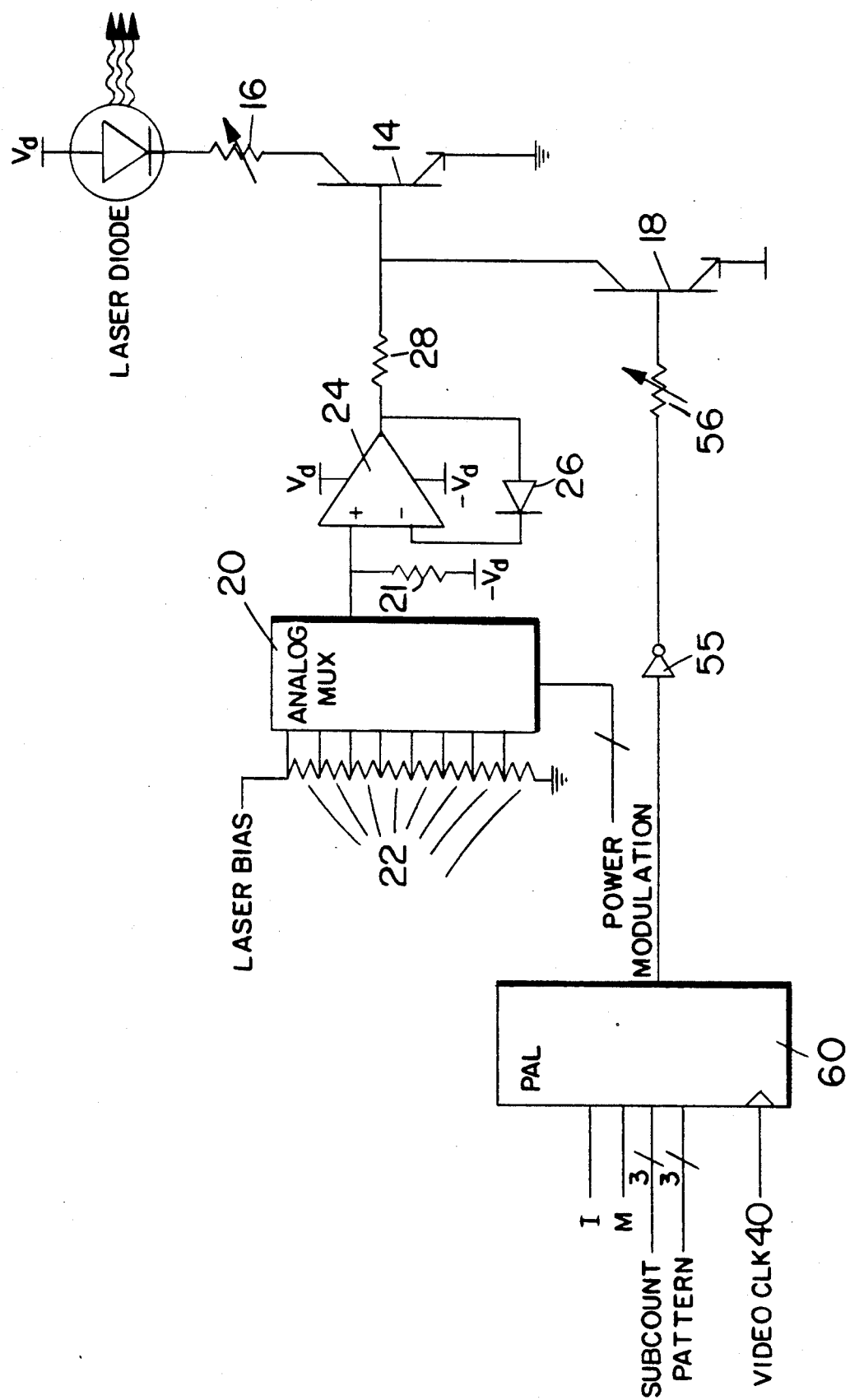
FIG. 2 shows schematically a first portion of a laser modulation circuit according to the present invention.

In FIG. 1, the size of darkened area 13 of the pixel region 10 is controlled by controlling a laser source 12 of the printer (such as laser diode 12 shown in FIG. 2). The size of the darkened area in the x-direction is determined by the width of the beam from laser 12 as it scans across the printing surface. In the preferred embodiment, the beam from laser 12 has a circular cross section, and a spatial cross sectional power distribution which is a three-dimensional Gaussian function. A typical power distribution of laser beam along the y-axis of FIG. 1 is shown along the side of the pixel region 10 of FIG. 1 and is labelled "BEAM POWER." Many laser printers use a focusing element to compress the beam in what is the x-dimension of FIG. 1. This creates a beam with a cross section which is oval rather than circular, and reduces spillover of the beam into adjacent pixels. However, for simplicity, the description of the present invention is limited to a beam with a circular cross section. Those skilled in the art will recognize that such a focusing technique may be used with the present invention without departing from the scope of the invention.

A minimum amount of laser energy is required to discharge any particular charged point in the pixel region 10 of FIG. 1. At the rate at which the beam is swept across the pixel region 10 in FIG. 1, cutoff points in the Gaussian distribution of the laser beam power define the area affected by the laser beam. These cutoff points are labelled as $X_c$ and $-X_c$ on the beam power curve of FIG. 1. Since the laser beam power is distributed in a three-dimensional Gaussian distribution about the central longitudinal axis of the beam, it will be understood that this cutoff power level defines a circle within the circular cross section of the beam. Any area of the pixel region 10 exposed to the portion of the laser beam within that circle is discharged by the laser. Furthermore, areas of the pixel region 10 exposed to portions of the beam outside the cutoff level for extended periods are also discharged due to a cumulative exposure effect. This effect will become more clear in the following discussion.

The laser beam sweeps across a middle section of the pixel region 10 in a left-to-right direction along the x-axis in FIG. 1. To control the width of the resulting affected area along the x-axis, the laser 12 is modulated to control the time it turns on and off. A typical modulation pulse is shown at the top of the pixel region 10 in FIG. 1. During the time the pulse is "high", the laser is on, and the initially charged region exposed and affected by the laser becomes discharged. In turn, it can be seen that the diameter of the circle defining the cutoff power level of the laser beam defines the length of the affected region 13 along the y-axis, and the width of the modulation pulse defines the width of the affected (discharged) region along the x-axis.

Within the pixel region 10 of FIG. 1, broken lines are drawn from the modulation pulse curve to the affected region 13 to demonstrate that the beginning and the end of the modulation pulse determine where the beam starts and ends, relative to the center of the beam (labelled points A and B). Since the cutoff perimeter of the Gaussian distribution of the beam power level determines where the OPC drum is discharged, an initial circular region of the drum is discharged when the laser is first switched on. This circular region is that centered about point A shown in FIG. 1, which represents the location of the center of the beam at the beginning of the modulation pulse. A similar circular region is shown centered about point B in FIG. 1, which represents the location of the center of the beam at the end of the modulation pulse. The broken line arcs within the discharged region 13 are for illustration purposes and show these two circular areas defined by the cutoff energy level of the beam at the beginning and at the end of the modulation pulse, respectively.

The center of the laser beam scans from point A to point B across the pixel region 10 of the OPC drum. The bold line enclosing the two circular regions in the pixel region 10 indicates the region 13 discharged by the laser. It will be noted that the discharged region 13 is slightly longer in the y-direction toward the middle of the pulse. Although the perimeter of the circle defining the cutoff power level of the laser beam typically defines the discharged region 13, beam portions just outside the cutoff region can cause the OPC drum to discharge if they illuminate the photoconductor for an extended period of time. Points C and D on the perimeter of the discharged region 13 in FIG. 1 fall directly in the center of the pulse period. These two points are outside the area swept by the circular cutoff region as the beam passes through the pixel region 10. However, portions of the laser beam having energies slightly below the cutoff energy illuminate the photoconductive material in the bulged areas of region 13 for an extended period of time, causing the discharge of those areas.

As has been shown in conjunction with FIG. 1, the area covered by the laser beam in the y-dimension can be controlled by controlling the power in the laser beam. Similarly, to control the size of the discharged area 13 in the x-dimension, the pulse switching of the laser diode 12 is controlled. For grayscaling purposes, the pulse power and the pulse switching are controlled by controlling laser source 12 shown in FIG. 2. Laser source 12 is part of a laser printer functioning in accordance with the present invention.

FIG. 2 shows a portion of a laser diode control circuit of the present invention. The laser diode 12 of the printer is connected to the collector branch of transistor 14. In the preferred embodiment, the diode 12 is current driven, and turns on when forward biased between 1.2 and 1.8 volts. For 5 mW operation, approximately 80 mA of current is needed, and the output is roughly proportional to the current. The emitter of transistor 14 is tied to ground, and a voltage $V_d$ is provided at the anode of the laser diode 12 to give the necessary transistor bias. Adjustable resistor 16 limits the current through the diode 12 and may be manually adjusted to the necessary resistance value. Current flow through the diode 12 is controlled in two different ways by controlling the input to the base of transistor 14. The magnitude of the current is controlled by controlling the voltage level at the base input of the transistor 14, and the switching of the transistor on and off is controlled by the switching of modultion transistor 18. The signals which control these two aspects of the invention are signals "power" and "modulation", respectively. The development of these two signals is now discussed in more detail.

The current level through the diode 12 determines the length along the y-axis of the discharged portion 13 of pixel region 10. This current level is controlled in the present invention by controlling the base voltage of transistor 14. As the base voltage increases, so does the current through the diode, and therefore the output power in the Gaussian distribution of the laser beam from the diode as well. The voltage level on the base of transistor 14 is determined by input signal "power", which is a three-bit digital signal generated as a grayscale input to the printer. The three-bit signal is input to an analog multiplexer 20, which passes one of eight different voltage inputs to the multiplexer output depending on the three-bit "power" input.

The different voltages at the multiplexer inputs are determined by a network of resistors 22, each of equal resistance value. The resistors serve to divide voltage "laserbias" into eight equal voltage drops, each connected to an input of the multiplexer 20. "Laserbias" is a DC voltage which represents the voltage necessary at the base of transistor 14 to get the desired maximum bias current for the laser diode 12. This voltage is modified for variations in the diode output, and is generated as a part of a feedback loop of the system which is discussed in further detail hereinafter. As shown, the resistor network 22 divides "laserbias" into eight equal parts for multiplexer output to the transistor 14.

When a three-bit power signal is input to the multiplexer 20, the corresponding voltage is selected by the multiplexer, and is output to voltage follower amplifier 24. The voltage output of the multiplexer 20 is developed across resistor 21, the opposite side of which is tied to voltage $-V_d$. The voltage follower is a unity gain amplifier which isolates the multiplexer 20 from the transistor 14, and provides the current sourcing capability necessary to feed the base of the transistor 14.

In the present embodiment, a diode 26 is provided in the feedback path of amplifier 24 to provide an additional 0.7 V voltage drop. This ensures that any of the eight voltage inputs to the multiplexer 20 drives the transistor 14 in the linear range of the transistor, since the base-emitter drop of the transistor 14 is 0.7 V. The output of amplifier 24 is fed through resistor 28 to the base of transistor 14 to control the current through the laser diode 12 and therefore the power in the laser beam. As discussed above, length along the y-axis is defined as a function of power in the laser beam. Thus, selection of the "power" input signal to the multiplexer 20 serves to select the length of the discharged region on the OPC drum in the y-dimension (as shown in FIG. 1).

To select the width of the discharged region of the OPC in the x-dimension, the laser is modulated (turned on and off) while scanning across the pixel region 10. A programmable array logic unit (PAL) 60 is used to generate an analog waveform "modulation". Signal "modulation" is synchronized with the scanning control of the printer, by triggering it with signal "videoclk40." Signal "videoclk40" is a signal generated from a "pixel clock" of the printer (signal videoclk5). The printer pixel clock produces a rising edge when the laser beam being scanned is at the beginning of a pixel region. The present embodiment uses the label "videoclk5" for the pixel clock to indicate that the clock is approximately 5 MHz. Since the present embodiment modulates the laser diode to within eight subpixel regions, the speed of the clock input to PAL 60 must be at least eight times that of the pixel clock ("videoclk5"). Thus, videoclk40 is derived by multiplying the clock rate of videoclk5 by eight, to produce a modulation clock speed of about 40 MHz. The "5" in "videoclk5" indicates that the signal is approximately 5 MHz. Similarly, the "40" in "videoclk40" indicates that the signal is approximately 40 MHz (eight times the frequency of "videoclk5").

Figure 3:
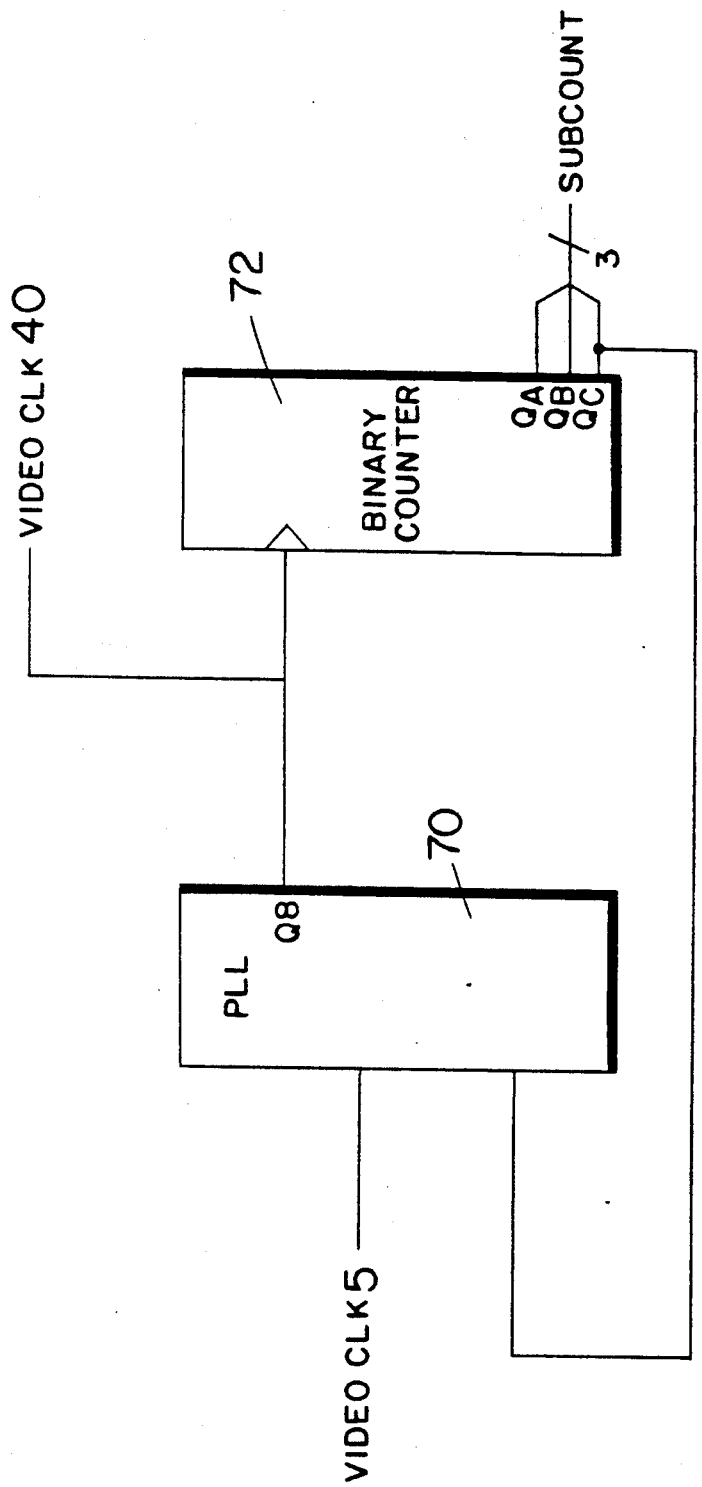
FIG. 3 shows schematically a clock circuit of the present invention.

A circuit for generating signal "videoclk40" from "videoclk5" is shown in FIG. 3. Phase-locked loop (PLL) 70 receives 5 MHz signal "videoclk5" from the printer. The PLL used in the present embodiment is a Signetics model NE/SE 564, and provides an output QO to the clock input of binary counter 72. The binary counter 72 is used with the PLL as a divide-by-eight counter. The outputs QC, QB and QA of counter 72 are the output bits of the counter 72, QC being the most significant bit. As the most significant bit of the three-bit count, QC changes at ⅛ the frequency of the clock signal. QC is fed back to the PLL 70, which forces a phase lock between the output of QC and signal "videoclk5". Since the counter 72 divides by eight, the PLL 70 must multiply the output by eight to force the two input signals to be matched in frequency. The PLL is preset to a characteristic frequency of about 40 MHz, making it easy for the PLL output to lock to the 40 MHz harmonic. This output signal is labelled "videoclk40", which is eight times pixel clock signal "videoclk5."

The three-bit output of binary counter 72 is labelled "subcount", and is used to count the subpixel regions over which PAL 60 modulates the laser diode for each pixel region. Signal "subcount" is input to the PAL 60 along with signal "videoclk40", and modulation information signals "pattern", "I", and "M". "I" and "M" are single bits, and "pattern" is a three-bit signal. Between these five bits, the PAL 60 is provided with all the information necessary to generate a desired pulse for switching on and switching off the laser diode within the eight subpixel regions.

Figure 4B:
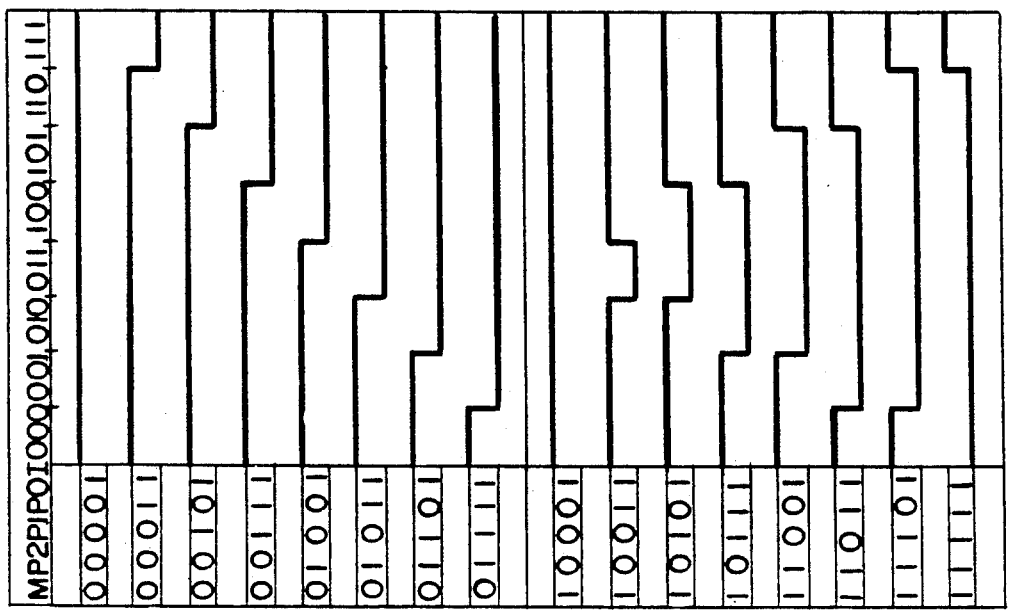
FIG. 4 is a modulation table showing a number of different modulation signals for different inputs received by the modulation circuit of the present invention.
Figure 4A:
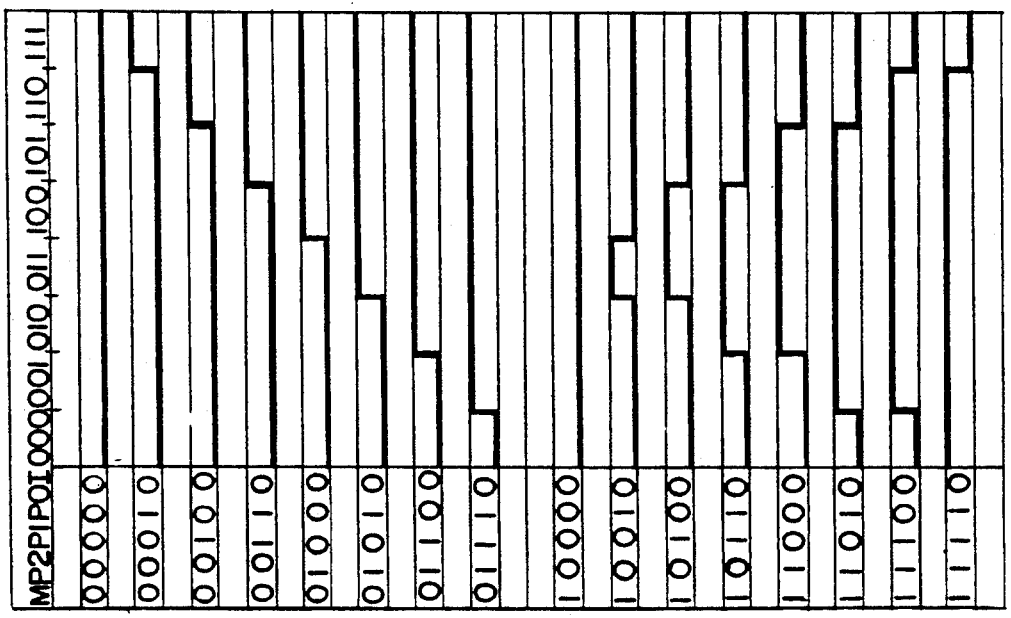

As shown in FIG. 2, signal "modulation" is input to transistor 18 through inverter 55 and variable resistor 56. Resistor 56 may be manually adjusted to assure that transistor 18 does not saturate, but does draw enough current to switch off transistor 14, thereby shutting off the laser. Since a high voltage at the base of the transistor 18 draws current away from the base of transistor 14 cutting off current flow through diode 12, the modulation signal generated by the PAL is the inverse of that necessary to drive transistor 18 for proper modulation of the laser diode 12. Therefore, inverter 55 is used to invert the signal "modulation" to properly control the diode. It is noted that the signals shown in the table of FIG. 4 represent signal "modulation", and are therefore the inverse of the signal driving transistor 18. Those skilled in the art will recognize that most PALs have inverted as well as non-inverted outputs, and that the inverter 55 would not be necessary if such a PAL was used. However, for purposes of description, the inverter 55 is shown as external to the PAL 60.

Variations of the possible modulation signals output by PAL 42 are shown in FIG. 4. The PAL 60 receives the three bits P0, P1 and P2 of signal "pattern", which designates the type of "modulation" waveform in one of two modes designated by bit "M". In FIG. 4, the regions in which the waveforms are contained represent the entire pixel region 10 of FIG. 1 along the x-dimension. Thus in the first mode, where bit "M" is low (zero), the eight different three-bit codes (P0, P1, P2) correspond to eight different possible starting points for a pulse which then continues to the end of the pixel region 10. These waveforms are demonstrated in the upper left hand portion of FIG. 4. When the mode bit "M" is high (1), the eight possible codes correspond to eight different waveforms centered about the center of the pixel region 10. This is illustrated by the eight waveforms in the lower left portion of FIG. 4.

Each of the first two modes discussed above takes effect when bit "I" is a digital low (zero). However, when bit "I" (the inverse bit) is high (one), the inverse of the waveforms illustrated in the left portion of FIG. 4 is produced. Thus, with "M" low and "I" high, the eight "modulation" waveforms which are the inverse of the eight waveforms in the upper left portion of FIG. 4 are produced. Each of the inverse pulses starts at the beginning of the pixel region 10 and ends at a different point along the x-axis of pixel region 10, as shown in the upper right portion of FIG. 4. Similarly, the centered waveform shapes of the lower left portion of FIG 4 with "M" high are inverted by "I" being high as shown in the lower right portion of FIG. 4. In these inverted waveforms, the pulse is high near the sides of the pixel region 10, but low in a particular segment near the center.

From the above it can be seen how PAL 60 generates the desired analog waveform "modulation" from the "I", "M" and "pattern" inputs. The PAL 60 uses signal "videoclk40" as a modulation clock, and uses the three-bit counter signal "subcount" as a running indication of the present subpixel within a pixel region. The example waveforms shown in FIG. 4 are particular to the present embodiment, and any desired waveforms within the subpixel resolution of the invention may be implemented with proper programming of the PAL 60.

Figure 5:
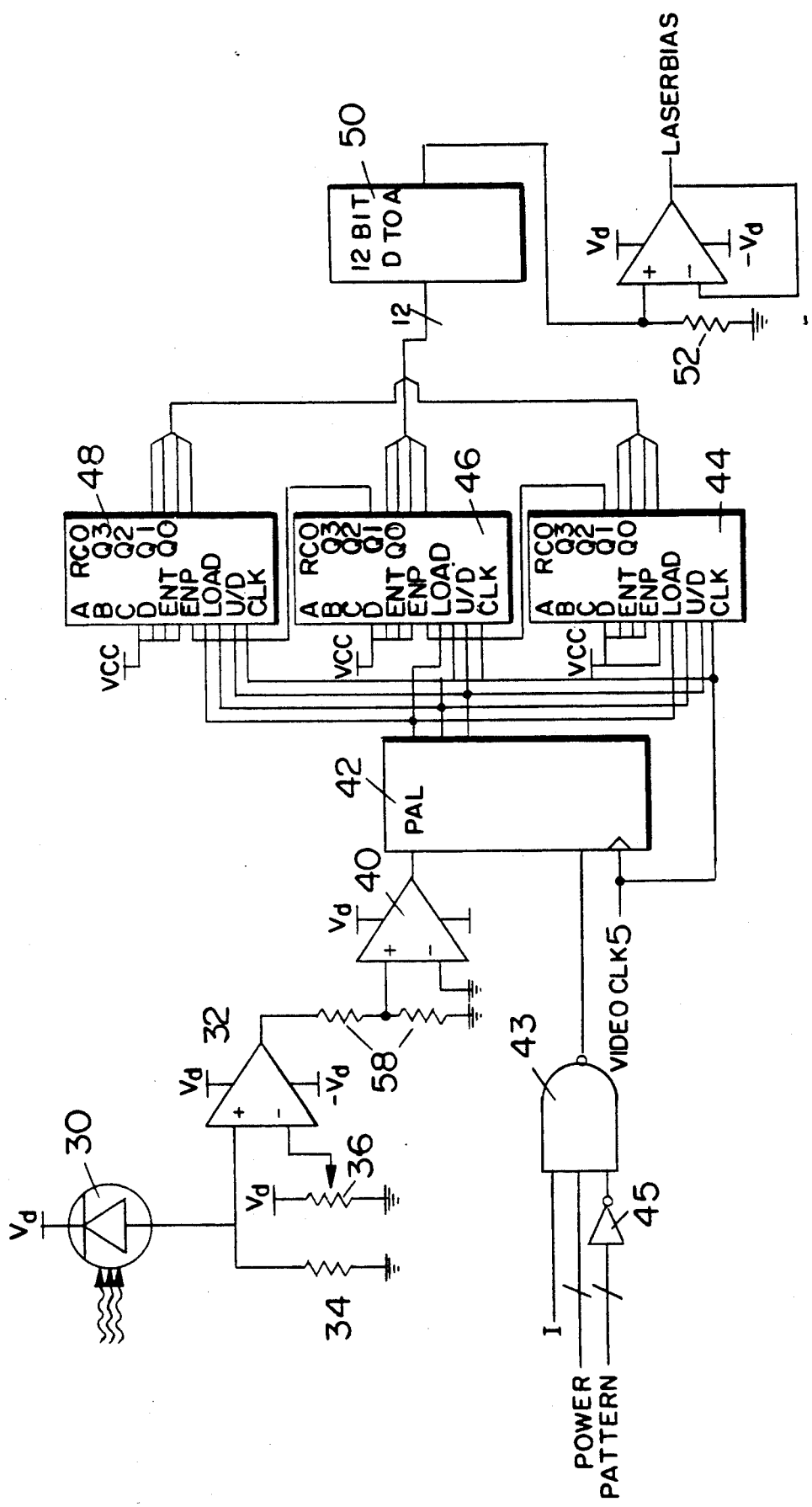
FIG. 5 shows schematically a feedback portion of a laser modulation circuit according to the present invention.

The present invention provides compensation for thermal drift of the laser diode 12. As stated previously, the "laserbias" signal of FIG. 1 varies according to feedback originating from a detection of the laser output. Shown in FIG. 5 is a photodiode 30 which is close enough to the laser diode 12 to detect the diode output signal. The photodiode 30 is reverse biased and lets through an amount of back-current which is proportional to the power output of the laser signal detected. In the present embodiment, the back-current is approximately 1 mA for 3 mW of laser output power. A voltage is developed across resistor 34 at the positive input terminal to open loop amplifier 32. This input voltage is compared to a variable set voltage which is set manually by adjusting variable resistor 36, tied between $V_d$ and ground. The amplifier 32 saturates positively or negatively depending on whether the input voltage is higher or lower than the set voltage. The output of amplifier 32 is then dropped across resistors 38, each of equal value, thus cutting the output voltage in half. The resulting voltage is then input to line receiver 40, which converts the input signals to TTL levels.

Depending on polarity of the voltage at its input, line receiver 40 outputs either a digital "high" or a digital "low" signal to programmable array logic unit (PAL) 42. In addition to receiving the line receiver signal, PAL 42 also receives a clock signal "videoclk5" and the output of NAND gate 43. NAND gate 43 is a seven-input gate the output of which is low when the laser diode is being operated at full power for the full duration of a pixel region. The inputs to NAND gate 43 are three-bit signal "power", three-bit modulation information signal "pattern" and modulation inversion bit "I".

When each of the seven inputs to NAND gate 43 are high, the output of NAND gate 43 is low. FIG. 4 demonstrates the output modulation waveforms of PAL 60 relative to the different digital input values of "pattern" (P2,P1,P0), "I" and "M". As shown, an output "modulation" waveform which is high for the duration of the pixel region is generated when "I" is high and the three bits of "pattern" are all low. Similarly, the maximum bias value is selected by multiplexer 20 when the three bits of digital input signal "power" are all high. Since before being input to NAND gate 43, "pattern" is inverted by inverter 45, the output of NAND gate 43 is low only when "pattern" has all bits low, "power" has all bits high, and bit "I" is high. Thus, it can be seen that the output of NAND gate 43 is only low when the laser pulse power is maximum and the laser diode 12 is on for the duration of the scanning of the pixel region.

The rising edges of signal "videoclk5" correspond to the moments at which a laser beam is at the beginning of a pixel region such as pixel region 10. "Videoclk5" therefore serves to synchronize the operations of PAL 42 with the rest of the printer. "Videoclk5" is a signal of about 5 MHz. However, it will be understood that any one of a number of different frequencies can be accomodated by the present invention.

The output of NAND gate 43 is used by PAL 42 to initiate the transfer of feedback information received from line receiver 40. The PAL 42 counts the number of pixel frames (using "videoclk5") which elapse while the output of NAND gate 43 is low. Each time five cycles of "videoclk5" are counted while the NAND gate output is low, the PAL generates corresponding "enable", "load" and "up/down" signals to each of three counters 44,46,48, which together make up a twelve-bit counter. The "enable" input, when received by the counters 44,46,48, allows the counters to accept new data and adjust stored values, as described below. The "load" input causes the counters to load in a new up/down signal from the PAL 42. Most laser printers have a period during which the laser is "off the page" (not discharging the OPC drum with useful data), and most printers keep the laser at full power during this time period to allow other calibration functions. Since this time period is usually equal to several hundred cycles of the pixel clock ("videoclk5"), the use of the five pixel/-full power criteria for updating the counter ensures that the counter value is adjusted at least once for each line. It will be understood that other means of ensuring periodic adjustment may also be used to accomodate other types of laser printers.

The twelve-bit counter is used to form a digital representation of the current bias voltage for the system. The up/down signal (U/D) from the PAL 42 is either a high or a low digital voltage, and corresponds to either an adjustment up or and adjustment down in the digital bias value, since that input signal causes the counters to either increase or decrease by one. The incremental counting of the counters is provided by the connection from ripple carry out (RCO) from counter 44 to counter 46, and the RCO from counter 46 to counter 48. This provides a twelve-bit resolution to the digital value of the bias voltage.

The twelve-bit output of the counters 44,46,48 is input to a digital-to-analog (D/A) converter 50. The D/A converter 50 generates an analog voltage in response to the digital input from the counters. This analog voltage is developed across resistor 52 and input to unity gain amplifier 54. The output of amplifier 54 is the desired bias voltage signal "laserbias", shown in FIG. 2. Thus, as shown in FIG. 5, feedback information is periodically used to update the bias voltage of the laser diode to provide necessary compensation for ambient variations.

The feedback loop of the present invention allows the "operating point" of the loop to be held in a digital register. Depending on the feedback, the operating point is either increased or decreased by a fixed amount. Most of the components of the loop are slow, and are allowed to be slow because the change to the operating point (typically due to thermal changes) is small. For example, the adjustment of the counters only when the laser is at full power for five consecutive pixel regions prevents rapid fluctuation of the stored digital count with fluctuation in the detected signal. Thus, the instability of the feedback loop is bounded by the magnitude of the changes to the operating point. In other words, the feedback loop is unstable, but the amount of instability is relatively small and only occurs within a valid output range.

While the invention has been particularly shown and described with reference to a preferred embodiment thereof, it will be understood by those skilled in the art that various changes in form and detail may be made therein without departing from the spirit and scope of the invention and defined by the appended claims. For example, with the "modulation" waveforms discussed above, many different shapes are possible, limited of course by the eight-bit resolution of the three-bit code. However, those skilled in the art will recognize that any desired modulation signal can be used to modulate the laser diode 12, and it is not necessary that the signal be generated by a PAL. Other hardware and software means or a combination thereof are suitable. Those skilled in the art will also recognize that the present invention could be adapted to a resolution other than eight bits. By using a higher resolution, more subpixel modulation regions could be accomodated.

I claim:

1. A laser diode modulation circuit comprising:
   a laser diode;
   a detector for detecting optical output power of the laser diode;
   a bias current feedback loop coupled to the detector for adjusting a maximum bias current value in response to changes in the optical output power detected by the detector;
   a power level selector, coupled to the laser diode, which in response to a power input signal controls a drive current of the laser diode as a variable percentage of the maximum bias current; and
   a modulator which modulates the current flow through the laser diode in response to a modulation signal, the modulator being coupled to the laser diode.

2. A modulation circuit according to claim 1 wherein the modulator comprises a signal generator which receives a digital input code and outputs the modulation signal in response thereto.

3. A modulation circuit according to claim 2 wherein the signal generator comprises a programmable array logic unit.

4. A modulation circuit according to claim 1 wherein the power level selector comprises an analog multiplexer.

5. A modulation circuit according to claim 1 wherein the maximum current bias value is stored as a digital code.

6. A modulation circuit according to claim 1 wherein the laser diode is a diode for a laser printer and the power output of the laser diode determines the size of a printed area in a first direction, while the modulation of the laser diode determines the size of said printed area in a second direction.

7. A control circuit for grayscale laser printing on a laser printer comprising:
- a current-driven laser diode having an optical output power which discharges charged elements in a pixel region of the laser printer;
- a photodiode detector for detecting the optical power output of the laser diode;
- a bias current feedback loop coupled to the photodiode detector, the feedback loop adjusting a maximum bias current value in response to changes in the optical power output detected by the detector, the feedback loop maintaining the maximum bias current value as a digital code and converting it to an analog value with a digital-to-analog converter;
- a power level selector which in response to a power input signal controls a drive current of the laser diode as a variable percentage of the analog value output by the digital-to-analog converter, the power level selector being coupled between the digital-to-analog converter and the laser diode; and
- a modulator which modulates a current flow through the laser diode in response to a modulation signal which causes switching of a current through the laser diode between a substantially zero current level and the drive current controlled by the power-level selector, the modulator being coupled to the laser diode.

8. A control circuit according to claim 7 wherein the size of a discharged area of a pixel region of the printer in a first direction is dependent on an optical power output of the laser diode, and size of said discharged area in a second direction is dependent on modulation of the laser diode.

9. A control circuit according to claim 7 wherein the modulator modulates current flow through the laser diode selectively for each of a plurality of pixel regions controlled by the laser printer.

10. A control circuit according to claim 7 wherein the power selector controls the drive current through the laser diode selectively for each of a plurality of pixel regions controlled by the laser printer.

11. A control circuit according to claim 7 wherein the modulator further comprises a programmable array logic unit which receives a digital input code and generates the modulation signal in response thereto.

12. A control circuit according to claim 7 wherein the size of the discharged area is proportional to a grayscale value for a pixel corresponding to the pixel region.

13. A control circuit according to claim 7 wherein the feedback loop further comprises a digital counter in which the digital code representing the maximum bias current is maintained, an adjustment to the bias current value being effected by incrementing or decrementing the count of the digital counter.

14. A control circuit according to claim 7 wherein the power level selector comprises an analog multiplexer.

15. A method of modulating a laser diode comprising:
- providing a laser diode having an optical power output which varies with drive current drawn through the diode;
- detecting the optical output power of the laser diode with a detector;
- adjusting a maximum bias current value in response to changes in the optical output power detected by the detector;
- controlling the drive current of the laser diode as a variable percentage of the maximum bias current value; and
- modulating the current flow through the diode in response to a modulation signal.

16. A method according to claim 15 further comprising generating the modulation signal with a signal generator which receives a digital input code and outputs the modulation signal in response thereto.

17. A method according to claim 15 wherein controlling the drive current of the laser diode comprises controlling the drive current with a power level selector which outputs an analog value in response to a power input signal.

18. A method according to claim 15 wherein the method comprises controlling the laser diode for a laser printer, and control of the power output of the laser diode determines a first dimension of a discharged area in a pixel region of the printer, while the modulation of the diode determines a second dimension of said discharged area.

19. A method of controlling a laser diode for grayscale printing with a laser printer comprising:
- providing a current-driven laser diode which discharges charged elements in a pixel region of the printer;
- detecting the optical output power of the laser diode with a photodiode detector;
- adjusting a maximum bias current value in response to changes in the optical output power detected by the photodiode detector, the maximum bias current value being maintained as a digital code;
- converting the digital code of the maximum bias current value to an analog value with a digital-to-analog converter;
- using a power level selector, controlling a drive current of the laser diode as a variable percentage of the analog value output by the digital-to-analog converter; and
- modulating a current flow through the laser diode in response to a modulation signal which causes switching of a current through the laser diode between a substantially zero current level and the drive current controlled by the power level selector.

20. A method according to claim 19 wherein a discharged area of the pixel region has a width which depends on the power output of the diode.

21. A method according to claim 19 wherein a discharged area of the pixel region has a length which depends on said modulating of the current flow through the diode.

* * * * *